United States Patent [19]
Brosnan

[11] Patent Number: 5,459,311
[45] Date of Patent: Oct. 17, 1995

[54] FIBER-OPTIC SYSTEM WITH DELAY LINE FOR LARGE DYNAMIC RANGE AND LOW PULSE WIDTH DISTORTION OF INITIAL DATA BITS

[75] Inventor: Michael J. Brosnan, Fremont, Calif.

[73] Assignee: Hewlett-Packard Company, Palo Alto, Calif.

[21] Appl. No.: 106,040

[22] Filed: Aug. 12, 1993

[51] Int. Cl.$^6$ .............................. H01S 3/10; H01J 40/14
[52] U.S. Cl. ...................................... 250/214 C; 359/161
[58] Field of Search .......................... 250/227.12, 214 C, 250/214 DC; 359/153, 161

[56] References Cited

U.S. PATENT DOCUMENTS

| | | | |
|---|---|---|---|
| 4,853,651 | 8/1989 | Voorman et al. | 330/294 |
| 4,918,402 | 4/1990 | Voorman et al. | 330/294 |
| 5,293,545 | 3/1994 | Huber | 359/161 |
| 5,311,346 | 5/1994 | Haas et al. | 359/161 |

FOREIGN PATENT DOCUMENTS

| | | | |
|---|---|---|---|
| 0087948 | 7/1981 | Japan | 359/153 |
| 0171138 | 10/1983 | Japan | 359/153 |
| 0158029 | 7/1991 | Japan | 359/153 |

OTHER PUBLICATIONS

Voorman, et al., "A One-Chip Automatic Equalizer for Echo Reduction in Teletext", *IEEE Transactions on Consumer Electronics*, vol. CE-27, No. 3, Aug., 1981, pp. 512 to 529.

Voorman, et al., "An Automatic Equalizer for Echo Reduction in Teletext on a Single Chip", *Philips Technical Review*, vol. 40, 1981, No. 11/12, pp. 320 to 328.

Williams, et al., "Electronic Filter Design Handbook", *L.C. Active, and Digital Filters*, Second Edition, pp. 7-10, 7-11.

*Primary Examiner*—Stephone B. Allen
*Attorney, Agent, or Firm*—Jonathan B. Penn; Patrick J. Barrett

[57] ABSTRACT

A fiber-optic system includes a photodetector for receiving optical signals from a light source, a threshold producing circuit coupled to the photodetector, and a delay block coupled to the photodetector. The threshold producing circuit produces a decision threshold voltage in response to signals from the photodetector. The delay block, formed of one or more stages of all-pass filter, delays the signals from the photodetector. The outputs of the delay block and the threshold producing circuit are connected to the inputs of a comparator. By providing a delayed signal, the decision threshold voltage is established in the comparator before the delayed signals reach the comparator. In this manner, pulse width distortion is largely eliminated in the first bit of data in burst mode data and the dynamic range of the overall system is preserved. In some cases, a multi-staged delay causes DC offset error in the delayed signal to the comparator. To reduce this error, a DC offset correction circuit coupled to the delay block corrects the DC offset error through the use of negative feedback across the delay block.

19 Claims, 4 Drawing Sheets

FIBER-OPTIC SYSTEM WITH DELAY LINE FOR LARGE DYNAMIC RANGE AND LOW PULSE WIDTH DISTORTION OF INITIAL DATA BITS

FIELD OF THE INVENTION

The present invention relates to fiber-optic systems, and, more particularly, to an analog delay line for reducing pulse width distortion of the first bit of burst mode data from a fiber-optic receiver.

BACKGROUND

Fiber-optic transceiver systems typically include a driver circuit for controlling a light source coupled by optical fiber to a photodetector coupled to a receiver chip. The driver circuit takes a digital pulse stream input and controls the light source to transmit optical signals through the optical fiber. The photodetector detects the optical signals and produces electric pulses in response to the optical signals. A switching circuit, also on the receiver chip, receives amplified electric pulses from the photodetector and produces a digital pulse stream in response to the electric signals. The digital pulse stream output from the receiver chip is ideally identical to that on the driver circuit.

In operation, the switching circuit uses an internal decision threshold voltage which is compared to each of a series of voltage signals from the amplified photodetector signal. The decision threshold determines the presence of a signal. Based on these comparisons, the switching circuit outputs the digital pulse stream.

A DC coupled fiber-optic receiver with a wide dynamic range typically derives its decision threshold from the amplitude of the voltage signals from the amplified photodetector signal. The decision threshold voltage ideally has an amplitude that is equal to one-half of the peak amplitude of the voltage signals. This allows the system to have high dynamic range and low pulse width distortion.

Presently available fiber-optic systems use either a fixed decision threshold or a threshold that adapts to the incoming voltage signals after the first voltage signal passes through or nearly passes through the switching circuit. Each such system suffers from disadvantages that limit its desirability. In systems having a fixed threshold, the potential range of input voltage signals is limited to those that are compatible with the fixed threshold. Although such systems do not suffer from excess pulse width distortion for the first pulses in data bursts, they have a limited dynamic range, typically about 10 dB.

In systems having a threshold that adapts to the first incoming voltage signal, the dynamic range is significantly greater, approximately 20 dB, but the first bit of digital output can suffer from excess pulse width distortion. This distortion occurs because, by the time the threshold adapts, the first voltage pulse has passed through the switching circuit. The problem is particularly detrimental for large signals because the threshold must initially be small to accommodate a small signal, then change to the correct large threshold. Since the threshold is initially far from correct, the first pulse width in a burst of data is distorted.

In many applications, the first bit of data from the switching circuit contains important information. For example, in some fiber-optic systems, the first edge of the first bit of data is used to synchronize a clock that samples the digital data output stream. If the first bit suffers from pulse width distortion, bit errors may result in the overall application due to sampling the data stream at inappropriate times.

It is, therefore, desirable to provide a fiber-optic system having a large dynamic range and low pulse width distortion for all digital data bits, including initial bits of burst mode data, output from the receiver chip.

SUMMARY OF THE INVENTION

A fiber-optic system according to the present invention includes a light source for producing optical signals and an optical fiber coupled to the light source for transmitting the optical signals. A photodetector coupled to the optical fiber detects the optical signals and converts the optical signals to electrical signals. A delay line is coupled to the photodetector for delaying the electrical signals from the photodetector. A switching circuit is coupled to the delay line for producing a digital pulse stream in response to the delayed electrical signal.

The delay line on the receiver chip delays the electrical signal to the switching circuit for a period sufficient for the decision threshold provided to the switching circuit to adapt to the incoming electrical signals. By allowing the threshold to be determined before the first delayed signal pulse reaches the switching circuit, the first bit of digital data output from the receiver chip has low pulse width distortion without limiting the overall dynamic range of the system.

BRIEF DESCRIPTION OF THE DRAWINGS

These and other features of the present invention will be better understood with reference to the following detailed description when considered in connection with the accompanying drawing wherein.

DETAILED DESCRIPTION

Figure 1:
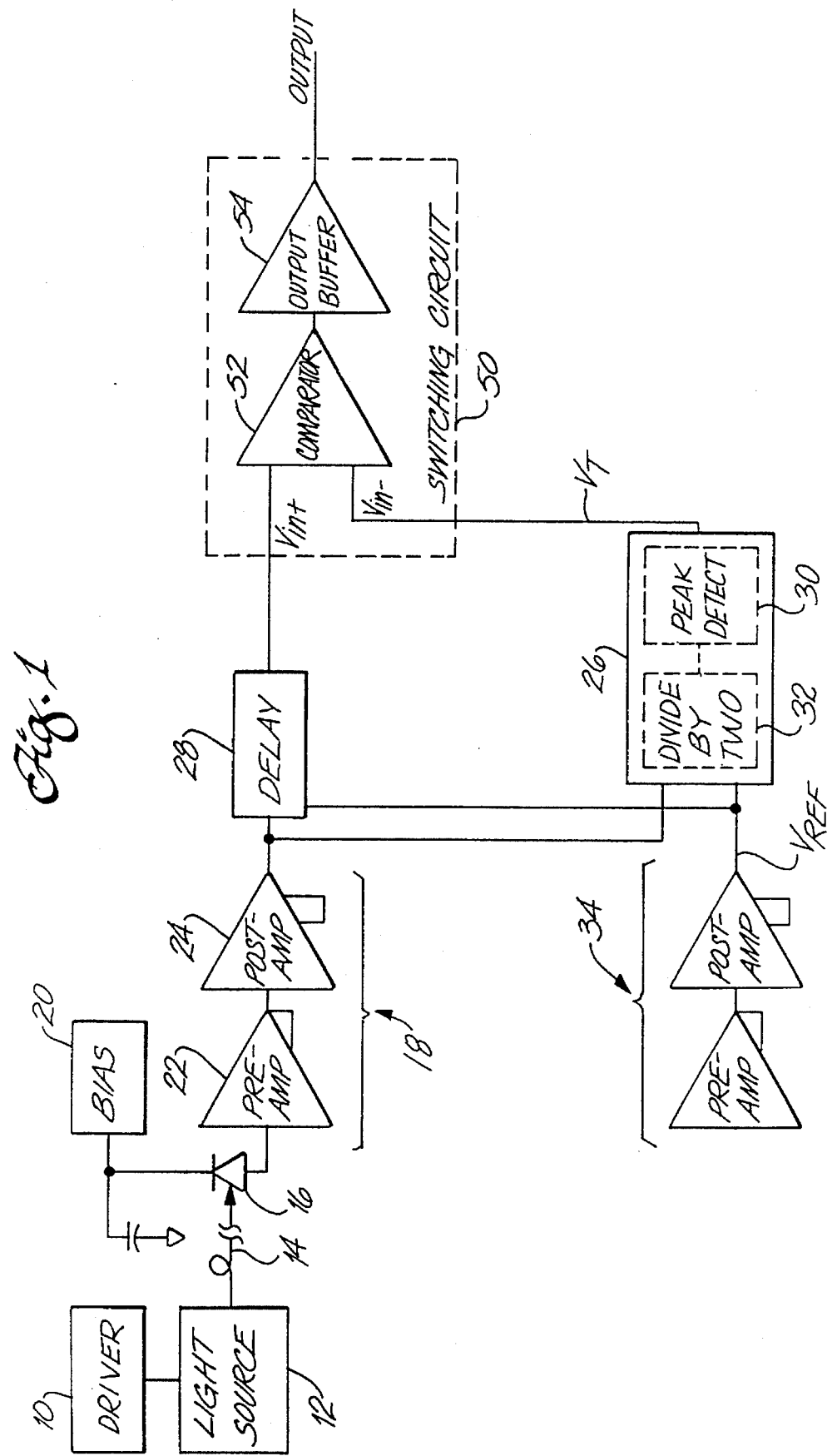
FIG. 1 is a generalized block diagram representation of a fiber-optic system having a delay block according to the present invention.

Referring to FIG. 1, a fiber-optic system according to the present invention includes a driver circuit 10 coupled to a light source 12. The light source, typically an LED or laser diode, is coupled to an optical fiber line 14 for transmitting optical signals from the light source. The optical fiber line is also coupled to a photodetector 16. A receiver chip 18 is spaced apart and optically isolated from the driver circuit and the light source. The cathode of the photodetector is coupled to a bias circuit 20. The anode of the photodetector is coupled to a conventional amplifier circuit comprising a transimpedence preamplifier 22 and a postamplifier 24.

In operation, digital data is provided as input to the driver circuit. The driver circuit controls the light source to produce optical signals indicative of the data to the driver circuit. The optical signals are transmitted across the optical fiber line, typically many feet in length, to the photodetector. The photodetector detects the optical signals and produces current signals in response to the detected optical signals. These electrical signals contain the same information as the optical signals.

The information-containing electrical signals from the photodetector are then amplified and passed to both a threshold producing circuit 26 and a delay block 28. The threshold producing circuit includes a conventional divide-by-two circuit 32 and a conventional peak detector 30 coupled to a conventional amplifier circuit 34. The amplifier circuit contains a preamplifier identical to that of the transimpedence amplifier 22 and a postamplifier identical to the postamplifier 24. These provide a matched reference voltage $V_{REF}$ to the threshold producing circuit and the delay block.

In operation, the divide-by-two circuit cuts the peak voltage to half of its original amplitude. The peak detector detects peak values of the output of the divide-by-two circuit to produce a decision threshold voltage $V_T$. The decision threshold voltage is preferably one half of the peak voltage for lowest pulse width distortion.

The delay block preferably produces delayed information-containing voltage signals substantially similar to the amplified electrical signals output from the photodetector. The delay time is preferably greater than the time it takes for the threshold producing circuit to stabilize at the correct decision threshold voltage $V_T$.

The outputs of the threshold producing circuit and the delay block are input to a switching circuit 50. The switching circuit includes a conventional comparator 52 and output buffer 54. The threshold producing circuit 26 provides the stable decision threshold voltage $V_T$, adapted to the undelayed information voltage signals from the amplified photodetector signal, to an input $V_{in-}$ of the comparator. The delay block provides a delayed voltage signal to an input $V_{in+}$ of the comparator.

In operation, the comparator compares the delayed voltage signals to the established DC decision threshold and outputs a high or low digital output signal based on the comparison. As numerous signals are compared, a digital pulse stream flows through the output buffer and out of the switching circuit.

Due to the simultaneous operation of the threshold producing circuit and the delay block, the decision threshold $V_T$ is established at the comparator before the first delayed voltage signal is applied to the comparator. In this case, the first bit of burst mode data from the output buffer is spared from the detrimental effects of pulse width distortion due to an unstablized decision threshold. The delay provides sufficient time for the decision threshold to stabilize before the first signal reaches the comparator. The digital pulse stream output is ideally substantially similar to the digital input to the driver circuit.

Figure 2:
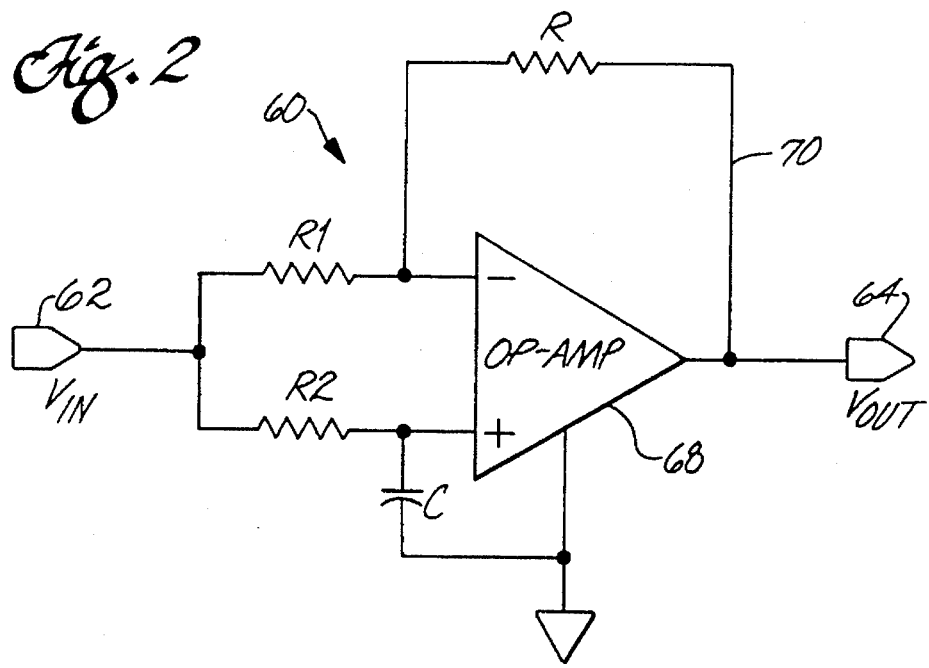
FIG. 2 is a circuit representation showing a presently preferred embodiment of an exemplary stage of the delay block.

The accuracy of the digital output at the switching circuit is largely dependent on the ability of the delay block to produce a delayed voltage signal substantially similar to the undelayed voltage signal. Referring to FIG. 2, for low frequency signals, a conventional first order all-pass filter 60 is preferable for providing the delayed voltage signal. This filter is characterized by an inherent delay and an ability to pass the entire bandwidth of amplified signal from the photodetector to the switching circuit as is necessary for precise operation of the transceiver.

More particularly, the delay circuit includes an input 62 for receiving the undelayed voltage signals $V_{IN}$ and an output 64 for delivering delayed voltage signals $V_{OUT}$ to the comparator 52 (FIG. 1). The input to the delay block is divided between two separate input paths comprising resistors R1 and R2 to the inverting and noninverting inputs of a conventional operational amplifier 68. The output of the op amp is coupled to a negative feedback loop 70 comprising a feedback resistor R. A capacitor C is also coupled to the noninverting input of the op amp. Preferably R is set to equal R1 and R2 is set to equal one half R to achieve an all pass filter response.

This type of all pass filter is presently preferred because of its selectable delay approximately equal to 2R2C, positive unity gain at low frequencies, and low output impedance. The delay circuit has a transfer function characterized by:

$$\frac{V_{OUT}}{V_{IN}} = \frac{1 - sR2C}{1 + sR2C}$$

The magnitude of the transfer function equals one at all frequencies. The phase shift starts at zero degrees and trends toward 180 degrees lag as frequency increases. An ideal delay has a phase shift linearly proportional to frequency. In practice, the first order all pass filter mimics the ideal transfer function well for low frequencies, delaying for a time approximately equal to 2R2C. However, at higher frequencies, the delay drops off significantly. Therefore, depending on the needed delay in the fiber-optic receiver for the threshold to stabilize and the bandwidth of the voltage signal from the photodetector, the first order all-pass filter may sometimes be effective.

To allow for increased dynamic range of the fiber-optic receiver and reduced pulse width distortion, the delay block must be able to provide a relatively longer delay for higher frequency signals (i.e, a greater delay-bandwidth product). In such cases, the first order filter is insufficient. In a presently preferred embodiment of a fiber-optic receiver, the delay needs to be greater than 50 nanoseconds, approximately constant up to a frequency of 30 MHz. To achieve the desired delay-bandwidth product, a higher order all-pass filter is used in the receiver.

It has been found that a fifth order all-pass filter provides an adequate delay-bandwidth product for a signal with harmonics up to 30 MHz. In effect, the delay in a fifth order all-pass filter is the sum of the delays in each of the five filters. Other numbers of all-pass filters may be appropriate for other signal frequencies. In the case of multi-order all-pass filters, however, DC offset errors within the delay block may cause the delayed voltage signal to deviate substantially from the undelayed signal input to the delay block. These errors are unacceptable for fiber-optic applications requiring DC coupling and high dynamic range.

Figure 3:
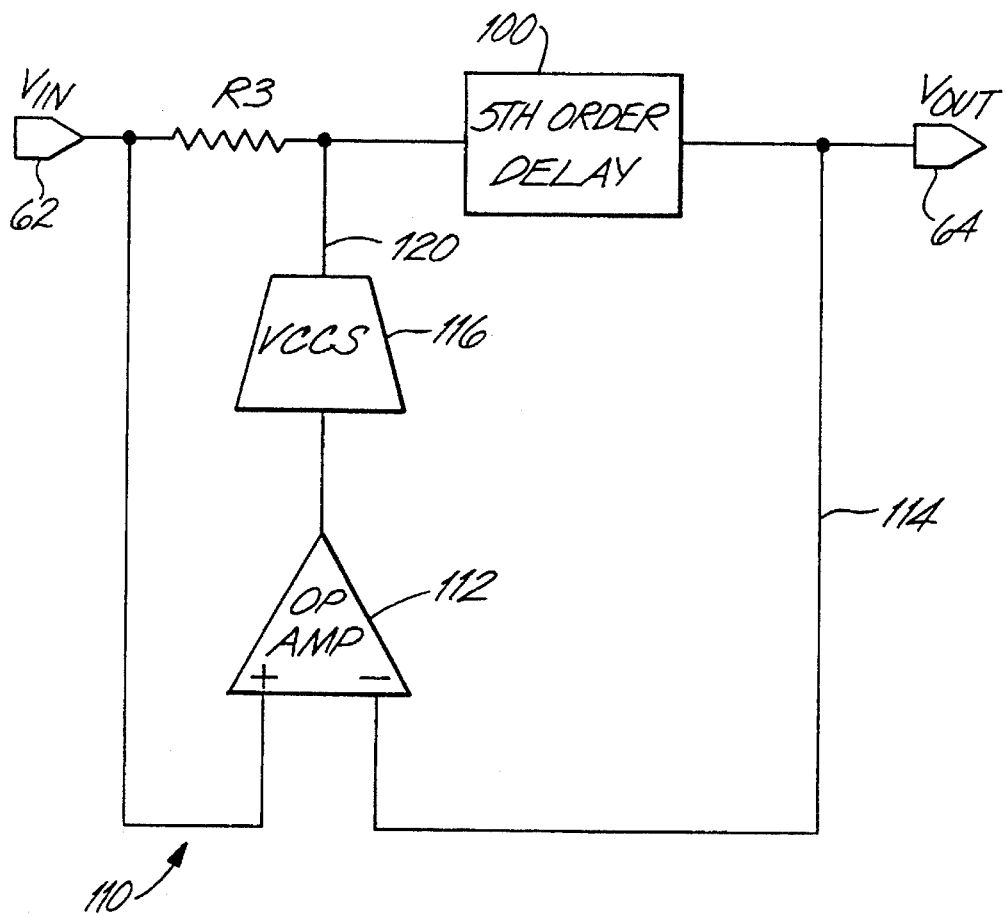
FIG. 3 is a block representation of a DC offset error correction circuit according to the present invention.

Referring to FIG. 3, a fifth order all-pass filter delay block 100 is shown coupled to a DC offset correction circuit 110. The DC offset correction circuit substantially eliminates DC offset error between the undelayed analog input voltage to the delay block and the delayed output voltage to the switching circuit comparator. In general, the DC offset correction circuit provides feedback that eliminates long-term differences between the undelayed input voltage $V_{IN}$ at the input 62 to the delay block and the delayed output voltage $V_{OUT}$ at the output 64 of the delay block. It does so by ensuring that the long term average voltage at the output of the delay block is substantially equal to the long term average of the input to the delay line. In this manner, the cumulative DC offset caused by each stage of a multi-order delay block is eliminated. In addition, the feedback network only affects low frequencies. Therefore, it has no meaningful effect on the frequency response or the pulse shape of the delayed output signals.

In a general implementation, the input 62 to the delay block is coupled to the noninverting input of an op amp 112 with moderately low gain-bandwidth product and a summing resistor R3. The output 64 of the delay block is coupled to the inverting input of the op amp through a feedback correction loop 114. The output of the op amp is coupled to a transconductance amplifier (voltage controlled current source, VCCS) 116 having an output 120. The transconductance amplifier drives the summing resistor R3 which is in series with the signal path. Current into and out of the summing resistor R3 produces a summing function by shifting the DC level in the undelayed voltage signal $V_{IN}$ to correct for any errors produced in the delay block.

In practice, the voltage controlled current source is set to source and sink currents up to a maximum value which corresponds to the highest DC offset which must be corrected. The value of the resistor R3 needs to be small compared to the input impedance of the delay circuit, but large enough so that maximum available current from the transconductance amplifier times the resistance of R3 is at least as large as the worst case DC offset produced by the delay block.

The DC offset correction circuit is preferred because it has essentially no effect on the magnitude versus frequency response of the original delay line. Since the feedback tries to eliminate input-to-output differences at low frequencies, the behavior of the circuit is unity gain at low frequencies. At high frequencies, the loop gain of the correction loop 114 falls well below one and it has no effect on the delayed voltage signal $V_{OUT}$. Since the delay line itself has unity gain, at high frequencies, unity gain will still be observed if the loop gain of the DC offset correction circuit is well below one. At intermediate frequencies, there is slight magnitude peaking of the frequency response (approximately 1 percent in the preferred embodiment).

The DC offset correction does affect the delay versus frequency response of the original delay line. Below the unity loop gain frequency of the correction loop, the phase delay and group delay are reduced, depending on DC loop gain, unity loop gain, frequency, delay line delay time and other factors. In the present application, such an effect is not a problem. All that is required is that the primary frequency components associated with each edge of the undelayed input signal $V_{IN}$ have substantially the same magnitude and phase delay.

Figure 4:
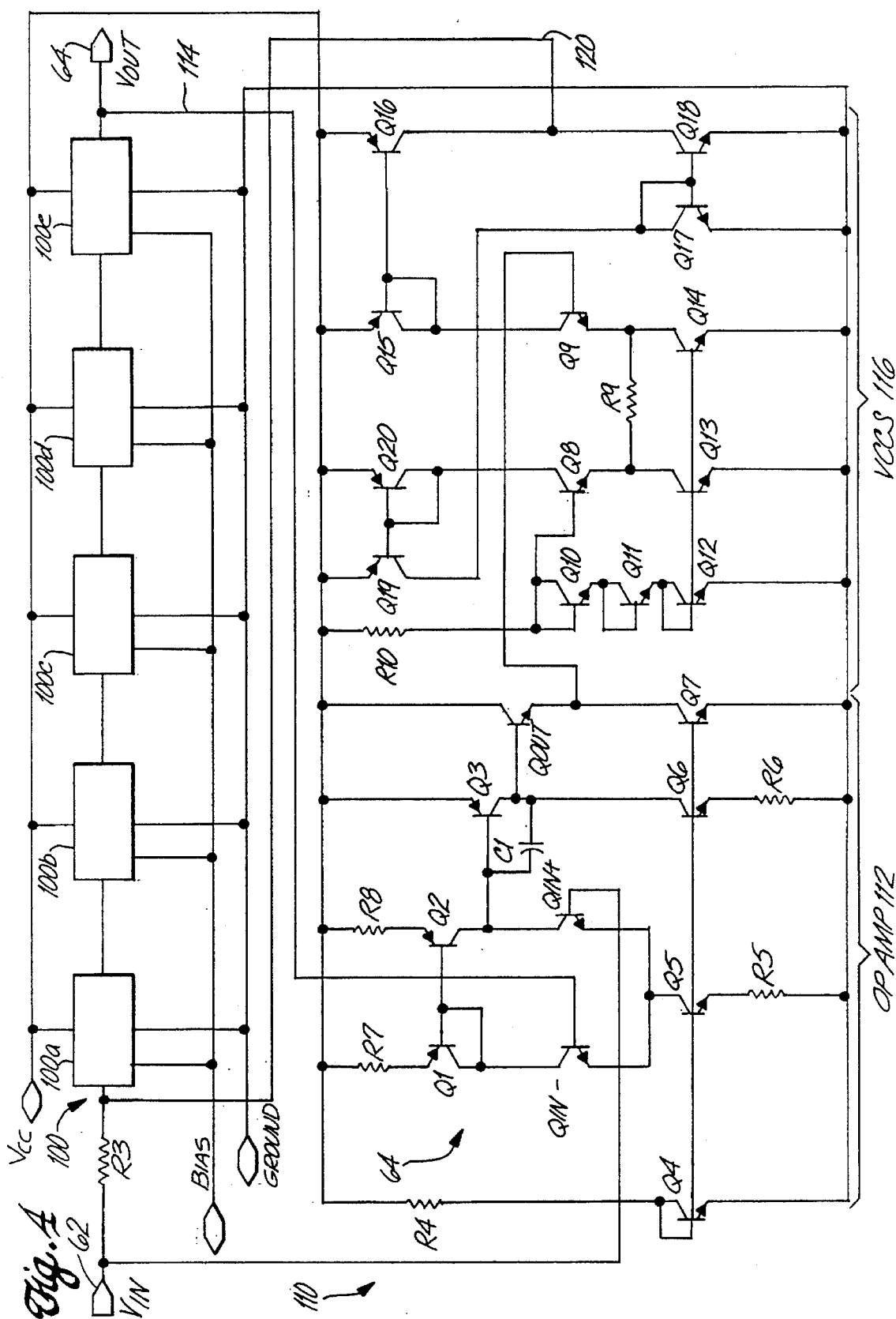
FIG. 4 is a circuit representation of the DC offset error correction circuit according to the present invention.

Referring to the circuit diagram of FIG. 4, the input 62 is coupled to the summing resistor R3, preferably 200 ohms, and the fifth order delay block 100. The delay block includes a cascade of five substantially similar delay stages 100a, 100b, ... 100e, each housing a first order all-pass filter (60, FIG. 2). In the drawing of this circuit, VCC, bias input and ground are included without description.

The op amp 112 includes a conventional differential voltage gain stage including transistors QIN+, QIN−, Q1, Q2, Q3, QOUT and associated conventional bias circuit. The bias circuit includes component transistors Q4, Q5, Q6, Q7 and resistors R4, R5, R6, R7, and R8. The differential inputs to the op amp 112 are the bases of transistors QIN+ and QIN−, respectively coupled to the input to the delay block 62 and the output 64 of the delay block (via the feedback correction loop 114). Transistor Q3 forms a level shifter. Transistor Q4 forms an output buffer. Transistors Q1 and Q2 form an active load mirror. The mirror is degenerated by resistors R7 and R8 in order to lessen the effect of mismatches between transistors Q1 and Q2.

In operation, the voltage inputs to the op amp at transistors QIN+ and QIN− are amplified by a large amount and converted to a ground referenced, single-ended output at the emitter of QOUT. A compensation capacitor C1 limits the gain-bandwidth product so that the feedback network is only effective at low frequencies. The bandwidth product is further limited by operating the differential input pair transistors QIN+ and QIN− at low collector current. Bias component transistor Q5 sets the collector current to the differential pair at approximately ½ microamp.

The transconductance amplifier 116 (voltage controlled current source, VCCS, FIG. 3) includes the remainder of the components in FIG. 4. Transistors Q8 and Q9 form the differential input pair of the transconductance amplifier. Resistor R9 provides emitter degeneration for the differential pair and sets the transconductance gain ($g_m$) to 2/R9 equalling ¼₀₀₀. One of the inputs is set to 3 $V_{BE}$ (base-emitter voltage) by R10 and three diode connected transistors Q10, Q11, Q12. Transistor Q12 also provides base drive voltages for transistor Q13 and Q14 which set the collector currents of the input pair of transistors Q8 and Q9 to about 150 microamps.

Three current mirrors are used to convert the difference between collector currents of transistors Q8 and Q9 to a single-ended current output (at transconductance amplifier output 120) with both source and sink capability. The current mirror formed of transistors Q15 and Q16 provides a means of sourcing current from the output of the transconductance amplifier by creating an inverted copy of the collector current of transistor Q9. The current mirror formed of transistors Q17 and Q18 provides a means of sinking current from the output of the transimpedence amplifier. This mirror is in turn driven by a mirror formed of transistors Q19 and Q20 which provides an inverted copy of the collector current of transistor Q8.

In operation, when the inputs to the amplifier are equal, equal magnitude currents flow in Q16 and Q18 so that no net current flows at the transconductance amplifier output 120. When the inputs to the amplifier are not equal, current flows in or out of the output 120 depending on the sign of the input imbalance, with a magnitude equal to ¼₀₀₀ times the input voltage difference. The maximum current that can flow is almost 300 microamperes, the total of the collector currents in Q13 and Q14.

Together with the 200 ohm summing resistor R3, the almost 300 microamp maximum current can shift the delay block 100 undelayed input voltage $V_{IN}$ by almost ±60 millivolts. As long as the DC offset error produced in the delay block is less than 60 millivolts, the DC offset correction circuit 110 will adequately shift the input voltage to cancel such offset. Accordingly, the delayed output signal $V_{OUT}$ at the output 64 of the delay block will have a very small DC offset error relative to the undelayed input voltage $V_{IN}$ 62 to the delay block. The residual DC error will be dominated by component mismatches between the transistors QIN+ and QIN− at the inputs to the op amp 112.

Figure 5:
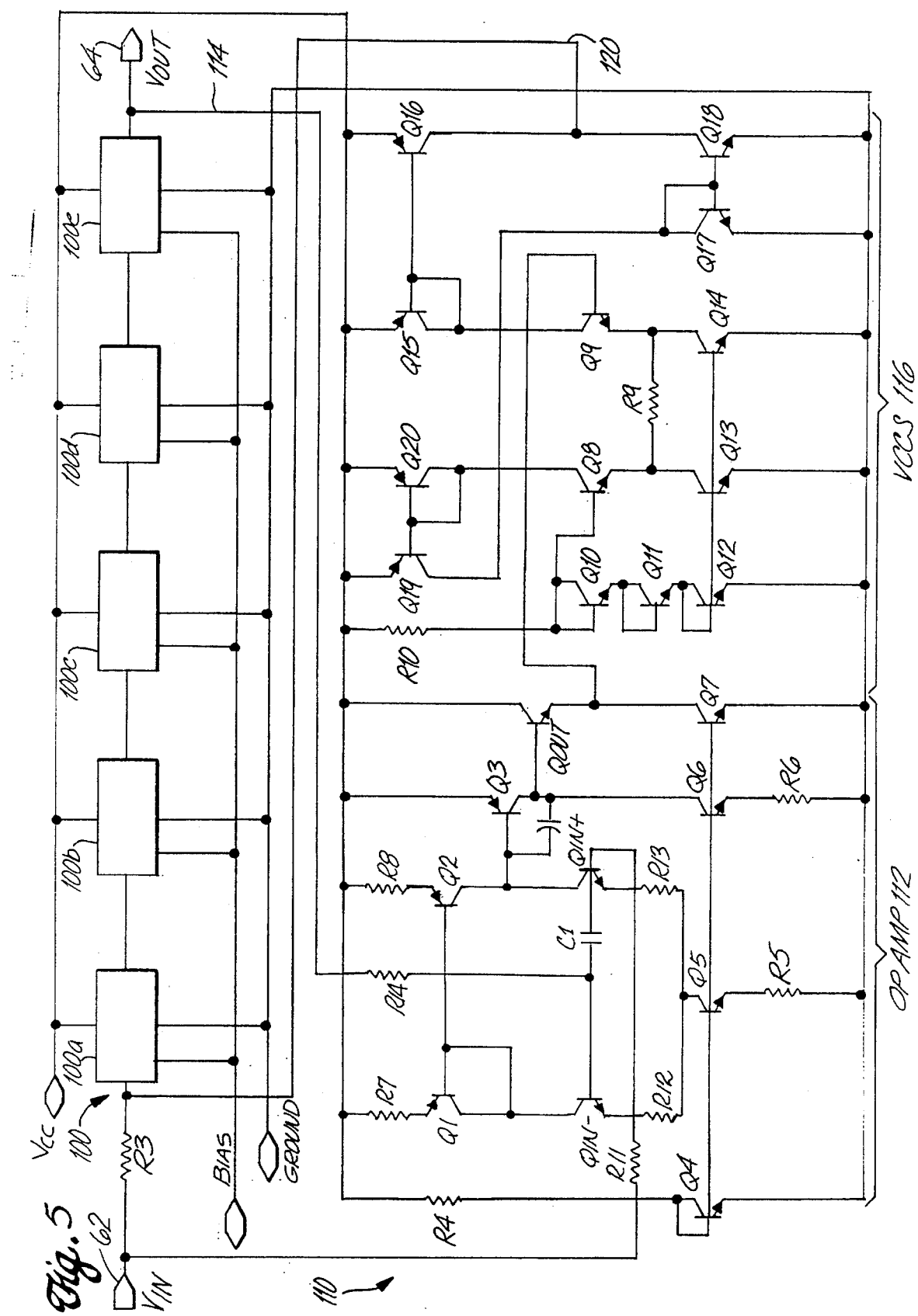
FIG. 5 is a circuit representation of a second embodiment of the DC offset error correction circuit according to the present invention.

The circuit shown in FIG. 5 is essentially identical to that shown in FIG. 4 and operates in similar fashion. Resistor R11 is coupled in series with the base of transistor QIN+ and resistor R14 is coupled in series with the base of transistor QIN−. Capacitor C1 is coupled between the bases of transistors QIN+ and QIN−. Together they form an RC filter that prevents slew rate limiting in Op Amp 112. Resistors R12 and R13 degenerate the amplifier and improve its linear operating range. Both the RC filter and the degenerating resistors are known circuits for these purposes.

The described embodiment of the fiber-optic system according to the present invention may be altered without departing from the scope of the claimed invention. For example, the order of a multi-order filter used to realize the delay block can be readily adapted to meet the requirements of the particular application in which it is used. In addition, the DC offset correction circuit can be tailored to provide adequate correction for various multi-stage delay blocks.

What is claimed is:

1. A fiber-optic system comprising:
   a photodetector coupled to an optical fiber for detecting optical signals from a light source and converting the optical signals to electrical signals;
   a delay block having an input coupled to the photodetector for delaying the signal from the photodetector for a predetermined minimum period required for switching circuit adaption; and
   a switching circuit coupled to an output of the delay block for producing a digital pulse stream in response to the delayed signal.

2. A fiber-optic system comprising:
   light detecting means for detecting optical signals from a remote light source and producing information-containing electrical signals in response to the optical signals;
   delay means coupled to the light detecting means for receiving the information-containing signals and producing delayed signals;
   threshold producing means coupled to the light detecting means for producing a decision threshold voltage signal in response to undelayed information-containing signals; and
   comparator means coupled to the delay means and the decision threshold producing means for comparing the delayed signals to the decision threshold voltage signals and producing a digital pulse stream output.

3. The fiber-optic system of claim 2 further comprising offset correcting means coupled to the delay means for correcting differences between undelayed voltage signals and delayed voltage signals.

4. The fiber-optic system of claim 2 wherein time delay between inputting the decision threshold voltage signals to the comparator means and inputting the delayed signals to the comparator means is sufficient for the decision threshold voltage signal to substantially stabilize.

5. The fiber-optic system of claim 2 wherein the delay means comprises at least one all-pass filter.

6. The fiber-optic system of claim 5 wherein the threshold producing means comprises a peak detector for detecting the peak amplitude of the information-containing electrical signal and producing a peak voltage signal indicative of the peak amplitude of the information-containing signal, and a divide-by-two circuit coupled to the peak detector for dividing the amplitude of the peak signal in half for producing a decision threshold voltage signal having half the amplitude of the peak signal; and wherein
   the delayed signal from the delay means is applied to the comparator means after the decision threshold voltage from the peak detector circuit is applied to the comparator means.

7. The fiber-optic system of claim 2 wherein the threshold producing means comprises a peak detector for detecting the peak amplitude of the information-containing signal and means for producing a decision threshold voltage signal having half the amplitude of the peak signal.

8. A fiber-optic system comprising:
   a photodetector for converting optical signals to undelayed electrical signals;
   a delay block having an input coupled to the photodetector for receiving electrical signals from the photodetector and producing at an output delayed electrical signals having DC offset error relative to the undelayed electrical signals; and
   an offset correction circuit coupled to the input of the delay block for minimizing DC offset error between the undelayed and delayed signals.

9. The fiber-optic system of claim 8 wherein the offset correction circuit comprises:
   a summing resistor coupled to the input of the delay block;
   an differential amplifier having an input coupled to the input of the delay block and an input coupled to the output of the delay block for producing a differential amplifier voltage signal in response to DC offset between the delayed signal and undelayed signal; and
   a transconductance amplifier coupled to the differential amplifier and the summing resistor for receiving the differential amplifier voltage signal and producing a current to the summing resistor for producing a correction voltage equal and opposite to the DC offset.

10. A fiber-optic system comprising:
    a photodetector coupled to an optical fiber for detecting optical signals from a light source and converting the optical signals to electrical signals;
    a delay block having an input coupled to the photodetector for delaying the signal from the photodetector;
    a switching circuit coupled to an output of the delay block for producing a digital pulse stream in response to the delayed signal; and
    means coupled to the switching circuit and to the photodetector for producing a decision threshold voltage signal and inputting the decision threshold voltage signal to the switching circuit before the delayed signal is input to the switching circuit.

11. The fiber-optic system of claim 2 wherein time delay between inputting the decision threshold voltage signal to the switching circuit and inputting the delayed voltage signal to the switching circuit is sufficient for the decision threshold voltage signal to substantially stabilize.

12. A fiber-optic system comprising:
    a photodetector coupled to an optical fiber for detecting optical signals from a light source and converting the optical signals to electrical signals;
    a delay block having an input coupled to the photodetector for delaying the signal from the photodetector, the delay block comprising at least one all-pass filter;
    a switching circuit coupled to an output of the delay block for producing a digital pulse stream in response to the delayed signal.

13. A fiber-optic system comprising:
    a photodetector coupled to an optical fiber for detecting optical signals from a light source and converting the optical signals to electrical signals;
    a delay block having an input coupled to the photodetector for delaying the signal from the photodetector, the delay block comprising a multi-order all-pass filter;
    a switching circuit coupled to an output of the delay block for producing a digital pulse stream in response to the delayed signal.

14. A fiber-optic system comprising:

a photodetector coupled to an optical fiber for detecting optical signals from a light source and converting the optical signals to electrical signals;

a delay block having an input coupled to the photodetector for delaying the signal from the photodetector;

a switching circuit coupled to an output of the delay block for producing a digital pulse stream in response to the delayed signal; and a peak detector coupled between the photodetector and the switching circuit for detecting the peak amplitude of the signal from the photodetector and producing a peak voltage signal indicative of the peak amplitude of the signal from the photodetector.

15. The fiber-optic system of claim 14 further comprising a divide-by-two circuit coupled between the peak detector and photodetector for dividing the amplitude of the peak voltage signal in half for producing a decision threshold voltage signal.

16. The fiber-optic system of claim 15 wherein the delayed signal from the delay block and the decision threshold voltage from the peak detector circuit are applied to the switching circuit, the decision threshold voltage being applied to the switching circuit before the delayed signal is applied to the switching circuit.

17. A fiber-optic system comprising:

a photodetector coupled to an optical fiber for detecting optical signals from a light source and converting the optical signals to electrical signals;

a delay block having an input coupled to the photodetector for delaying the signal from the photodetector;

a switching circuit coupled to an output of the delay block for producing a digital pulse stream in response to the delayed signal; and an offset correction circuit coupled to the delay block for minimizing DC offset errors in the delayed voltage signal.

18. The fiber-optic system of claim 17 wherein the offset correction circuit comprises noninverting and inverting inputs, one input being coupled to the input of the delay block and the other input being coupled to the output of the delay block through a feedback loop.

19. The fiber-optic system of claim 18 wherein the offset correction circuit comprises an output coupled to a summing resistor, and the summing resistor is coupled in series with the delay block input.

* * * * *